TRANSISTOR AMPLIFIER WITH AUTOMATIC GAIN CONTROL
Filed Aug. 7, 1969
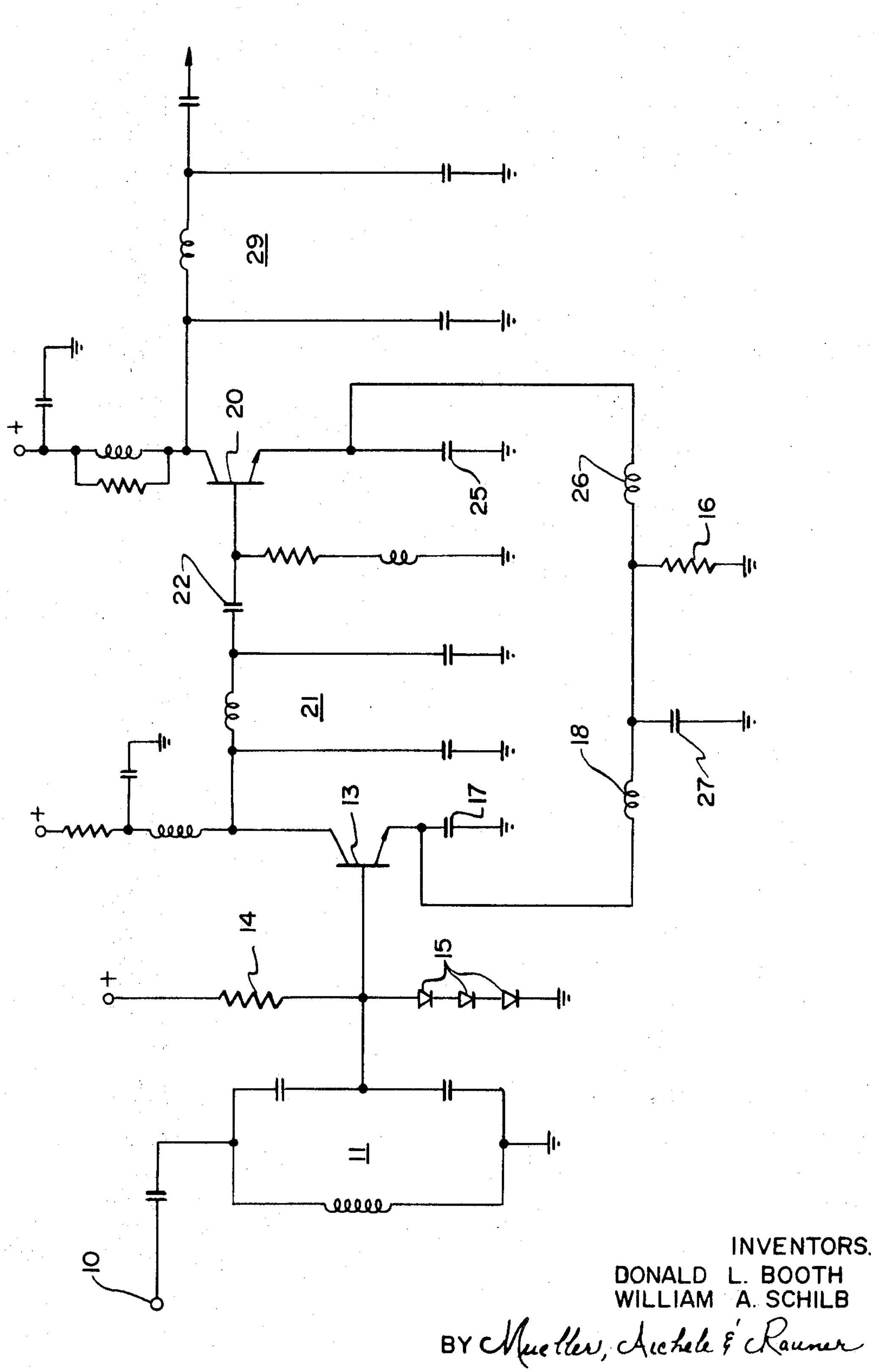
INVENTORS.
DONALD L. BOOTH
WILLIAM A. SCHILB
BY Mueller, Aichele & Rauner
ATTORNEYS.

United States Patent Office 3,559,088
Patented Jan. 26, 1971

3,559,088

TRANSISTOR AMPLIFIER WITH AUTOMATIC GAIN CONTROL

Donald L. Booth, Chicago, and William A. Schilb, Lombard, Ill., assignors to Motorola, Inc., Franklin Park, Ill., a corporation of Illinois

Filed Aug. 7, 1969, Ser. No. 848,247
Int. Cl. H03g *3/30*
U.S. Cl. 330—29 5 Claims

ABSTRACT OF THE DISCLOSURE

A two-stage RF transistor amplifier, operating with a class A first stage and a class C second stage has a constant DC biasing voltage on the base of the input stage transistor and a DC feedback path established by a common-emitter resistor for the transistors of both stages, in order to maintain the RF power output constant over a wide range of RF input and independent of the gain of the individual transistors.

BACKGROUND OF THE INVENTION

In the operation of RF radio systems it is desirable in many applications to provide a transmitter in which a constant power is obtained at the output, irrespective of variations of input power and the parameters of the individual components used in the RF amplifier stages. Automatic drive limiting circuits have been used in RF amplifiers for sensing some parameter of the final stage of the amplifier to produce a DC bias voltage which operates on additional circuitry to reduce the voltage across the driver stage, thereby reducing the RF signal arriving at the final stage and preventing destruction of the final stage. Such automatic drive limiting circuits, however, operate only to reduce RF gain and cannot operate to increase the gain in the event that the input to the amplifier should drop for some reason.

SUMMARY OF THE INVENTION

Accordingly it is an object of this invention to provide an improved automatic gain control for a multi-stage amplifier.

It is an additional object of this invention to maintain constant the gain of a two-stage transistor amplifier by the use of a DC feedback signal coupled with the provision of a constant DC bias voltage on the input of the first stage of the amplifier.

It is a further object of this invention to provide a multi-stage transistor amplifier with an automatic gain control circuit utilizing a common-emitter impedance for the transistors of the stages of the amplifier and a constant DC biasing voltage on the base of the transistor of the input stage of the amplifier.

In accordance with the preferred embodiment of this invention, a transistor amplifier having automatic gain control includes a circuit for establishing a substantially constant DC bias voltage on the base of the first transistor in the input stage of the amplifier; and a common-emitter impedance is connected in circuit between a point of DC reference potential and the emitters of the transistors in both of the stages of the amplifier. Since the DC voltage on the base of the first stage transistor is determined by the constant supply, the emitter voltage of the first transistor also is fixed by the bias, causing the sum of the currents from the two stages to be constant for all conditions of RF input. Thus, a drop in the current drawn by one stage must be matched by an increase in the current passing through the other stage, which varies the gain accordingly and maintains the RF power obtained from the output of the second stage at a constant level.

BRIEF DESCRIPTION OF THE DRAWING

The sole figure of the drawing is a schematic diagram of a preferred embodiment of the invention.

DETAILED DESCRIPTION

Referring now to the drawing, there is shown a schematic diagram of a two-stage RF transistor amplifier employing an automatic gain control circuit in accordance with a preferred embodiment of this invention. Input signals for the amplifier are obtained for a terminal 10, which may be connected to the oscillator of the transmitter circuit with which the RF amplifier is to be used. The frequency of the input RF signals is determined by an oscillator tank circuit 11, from which the signals are applied to the base of a first NPN amplifier transistor 13 in the first stage of the two-stage amplifier circuit.

Operating DC potential for the transistor 13 is obtained from a voltage divider consisting of a resistor 14 and three series-connected diodes 15, connected between a source of positive potential and ground. The base of the transistor 13 is connected to the junction between the resistor 14 and the first of the diodes 15, with the diodes 15 being operated in their forward-biased conductive relationship; so that a relatively constant DC voltage drop is obtained thereacross irrespective of variations of the B+ voltage supply. Thus, the DC operating level on the base of the transistor 13 is maintained constant.

With the DC bias on the base being maintained constant, the voltage present on the emitter of the forward-biased transistor 13 also is maintained constant and is lower than the voltage on the base of the transistor 13 by the amount of the base-to-emitter voltage drop of the transistor.

The emitter of the transistor 13 is connected to AC ground through a capacitor 17 and to DC ground through a choke 18 and an emitter resistor 16. Operating potential for the amplifier stage including the transistor 13 is applied to the collector of the transistor 13 from a source of B+ potential in a conventional manner.

The input stage of the amplifier including the transistor 13 is a low power stage operated class A by proper adjustment of the circuit parameters, with the output signals present on the collector of the transistor 13 being coupled to the base of a transistor 20 in the second stage of the amplifier circuit through a power transfer matching circuit 21 and a coupling capacitor 22. The transistor 20 is connected in a higher power amplifier stage operating class C, and the emitter of the transistor 20 is connected to RF ground through a capacitor 25 and also is connected to DC ground through a choke 26 and the resistor 16. Thus, the resistor 16 forms a common-emitter resistor for the DC current paths of the transistors 13 and 20.

Since the voltage on the emitter of the transistor 13 is fixed at a predetermined level by the forward-biased diode string 15, the sum of the currents from the two stages 13 and 20 flowing through the resistor 16 must be constant for all conditions of RF input and the transistor parameters used, since this emitter voltage also is the voltage drop across the resistor 16 for DC current. As a consequence, if the RF input to the second stage transistor 20 drops, the current drawn by the transistor 20 also drops; and that drop in current must be matched by a corresponding increase in the current in the first stage to maintain the voltage drop across the resistor 16 at the constant level. When this occurs, the gain of the first stage is increased and aids in compensating for the drop in RF power to the second stage which initiated the corrective action.

On the other hand, if the RF input to the second stage rises, the current drawn by the second stage also rises;

and that rise in current is matched by a corresponding decrease in current in the first stage. This in turn decreases the gain in the first stage, aiding in compensating for the rise in RF power to the second stage which initiated the corrective action. Thus, the power output obtained from the collector of the transistor 20 in the second stage is maintained at a constant level.

The output from the circuit is obtained from the collector of the transistor 20 and is applied through a matching circuit 29 to the next stage of the transmitter circuit.

The choke coils 18 and 26, which interconnect the emitters of the transistors 13 and 20, operate to prevent the RF signals present on the emitter of the transistor 20 in the second stage from being fed back to the emitter of the transistor 13 in the first stage. In addition, a capacitor 27 is connected across the resistor 16 for eliminating low frequency oscillations which the DC feedback otherwise might tend to cause.

In operating a circuit constructed as shown in the drawing, the input power to the two-stage amplifier dropped by approximately 11 db with an output power drop of only 1 db. This is approximately 4 db better than the performance of a similar circuit without the DC feedback between the emitters of the transistors 13 and 20. It also has been observed that changing the transistors in the circuit does not change the current drawn by the gain-controlled circuit, so that the circuit is independent of the particular characteristics of the transistors used in this respect. The changing of the transistors 13 and 20 causes a lesser change in the output power of the gain-controlled circuit than in a similar circuit not utilizing the DC feedback between the emitters of the transistors 13 and 20. In addition, it should be noted that an effective RF gain control is accomplished without the addition of extra transistors or elaborate circuitry.

What is claimed is:

1. An RF transistor amplifier having automatic gain control including in combination:

a first linear RF amplifier stage including a first transistor having base, collector, and emitter electrodes;

means for establishing a substantially constant DC bias voltage on the base of the first transistor;

a second non-linear RF amplifier stage connected to the output of the first amplifier stage and including a second transistor having base, collector, and emitter electrodes;

a common-emitter impedance connected in circuit between a point of DC reference potential and the emitters of both of the transistors, the common-emitter impedance being the sole DC connection between the point of reference potential and the emitters of the transistors;

means for connecting the emitters of the first and second transistors to RF ground;

means for applying RF signals to the base of the first transistor; and means for blocking feedback of RF signals from the emitter of the second transistor to the first transistor.

2. The combination according to claim 1 wherein the first stage is operated class A and the second stage is operated class C.

3. The combination according to claim 1 wherein the common-emitter impedance is a resistor and wherein the AC feedback blocking means includes at least one inductance connected between the emitter of one of the transistors and the resistor.

4. The combination according to claim 3 wherein the point of DC reference potential is ground potential and the means for establishing the substantially constant DC bias voltage includes a voltage divider connected between ground and a source of DC voltage, the voltage divider including a predetermined number of series-connected, forward-biased diodes connected between ground and the base of the first transistor.

5. The combination according to claim 4 wherein the first and second transistors are of the same conductivity type and wherein the collector of the first transistor is connected in circuit with the base of the second transistor.

References Cited

UNITED STATES PATENTS

| | | | |
|---|---|---|---|
| 2,831,968 | 4/1958 | Stanley et al. | 330—21X |
| 3,310,752 | 3/1967 | Forsthuber et al. | 330—29X |
| 3,366,889 | 1/1968 | Avins | 330—25X |
| 3,436,675 | 4/1969 | Lunau | 330—25X |

ROY LAKE, Primary Examiner

J. B. MULLINS, Assistant Examiner

U.S. Cl. X.R.

330—22, 25, 30